United States Patent
Lyons

(10) Patent No.: US 6,399,284 B1
(45) Date of Patent: *Jun. 4, 2002

(54) SUB-LITHOGRAPHIC CONTACTS AND VIAS THROUGH PATTERN, CVD AND ETCH BACK PROCESSING

(75) Inventor: Christopher F. Lyons, Fremont, CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/336,619

(22) Filed: Jun. 18, 1999

(51) Int. Cl.$^7$ ................................. G03F 7/00
(52) U.S. Cl. ..................... 430/313; 430/316; 430/317
(58) Field of Search ............... 430/313, 316, 430/317; 438/267

(56) References Cited

U.S. PATENT DOCUMENTS

| | | | | |
|---|---|---|---|---|
| 4,495,220 A | * | 1/1985 | Wolf et al. .................... 427/82 |
| 4,996,133 A | * | 2/1991 | Brighton et al. ............. 430/313 |
| 5,219,789 A | | 6/1993 | Adan .......................... 437/192 |
| 5,229,326 A | | 7/1993 | Dennison et al. ........... 437/195 |
| 5,502,008 A | | 3/1996 | Hayakawa et al. ......... 437/225 |
| 5,521,121 A | | 5/1996 | Tsai et al. .................... 437/190 |
| 5,554,254 A | | 9/1996 | Huang et al. ............. 156/625.1 |
| 5,576,242 A | | 11/1996 | Liu ............................. 437/191 |
| 5,580,821 A | | 12/1996 | Mathews et al. ........... 437/187 |
| 5,663,102 A | | 9/1997 | Park ............................. 438/626 |
| 5,828,130 A | | 10/1998 | Miller et al. ................ 257/754 |
| 5,843,625 A | * | 12/1998 | Hause et al. ................ 430/313 |
| 5,952,156 A | * | 9/1999 | Chin et al. .................. 430/316 |
| 6,042,999 A | * | 3/2000 | Lin et al. .................... 430/316 |
| 6,051,369 A | * | 4/2000 | Azuma et al. .............. 430/312 |
| 6,080,529 A | * | 6/2000 | Ye et al. ...................... 430/318 |
| 6,099,598 A | * | 8/2000 | Yokoyama et al. ........ 29/25.01 |

* cited by examiner

*Primary Examiner*—Kathleen Duda
(74) *Attorney, Agent, or Firm*—Renner, Otto, Boisselle & Sklar, LLP

(57) ABSTRACT

In one embodiment, the present invention relates to a method of forming a sub-lithographic via or contact, involving the steps of providing a substrate comprising a conductor having a width of about 0.25 μm or less over a portion of the substrate and an insulating film over the conductor and the substrate; etching a preliminary via in the insulating film over the conductor, the preliminary via defined by sidewalls in the insulating film; depositing a CVD layer over the substrate, the insulating film, and the conductor, the CVD layer having a vertical portion adjacent the sidewalls of the insulating film and a horizontal portion in areas not adjacent the sidewalls of the insulating film; removing the horizontal portion of the CVD layer thereby forming the sub-lithographic via over the conductor, and depositing a conductive material into the sub-lithographic via to form a sub-lithographic contact, the sub-lithographic via and/or sub-lithographic contact having a width of less than about 0.25 μm.

20 Claims, 3 Drawing Sheets

SUB-LITHOGRAPHIC CONTACTS AND VIAS THROUGH PATTERN, CVD AND ETCH BACK PROCESSING

TECHNICAL FIELD

The present invention generally relates to forming contacts and vias with improved overlap to small underlying conductors. In particular, the present invention relates to forming contacts and vias on a sub-lithographic scale using chemical vapor deposition and etch back processing.

BACKGROUND ART

In the semiconductor industry, there is a continuing trend toward higher device densities. To achieve these high densities there has been and continues to be efforts toward scaling down the device dimensions on semiconductor wafers. In order to accomplish such high device packing density, smaller and smaller features sizes are required as well as increased multilevel architecture. This includes the width and spacing of interlevel connections, such as contacts and vias. Since numerous contacts and vias are typically present on a semiconductor wafer, the trend toward higher device densities is a notable concern.

An interlevel connection typically includes a landing conductor, directly over which a contact is formed. Generally speaking, lithographic process limitations determine the minimum conductor width required for landing an interlevel connection. An underlying conductor must possess a width large enough to accommodate the via (the diameter of the via) in addition to providing some margin for misalignment between the respective layers. As the trend toward higher device densities continues, it is increasingly difficult to form vias/contacts directly over landing conductors. FIGS. 1 and 2 illustrate common problems associated with forming vias/contacts over and underlying conductor.

Referring to FIG. 1, an incomplete landing is illustrated. The via 10 is too wide over underlying conductor 12 within the insulating material 14. The incomplete landing is primarily due to the limitations of printing dimension. Referring to FIG. 2, another incomplete landing is illustrated. The via 10 is not directly positioned over underlying conductor 12 within the insulating material 14. The incomplete landing is primarily due to misalignment of the respective layers. The problems illustrated in FIGS. 1 and 2 can lead to shorting out, contamination, and other deleterious effects to the conductor and/or insulator materials. And these problems are exacerbated by the trend to decrease the width of features such as the underlying conductor, especially at dimensions of about 0.25 $\mu$m or less.

Patterning features having dimensions of about 0.25 $\mu$m or less with acceptable resolution is difficult at best, and impossible in some circumstances. Patterning interlevel connections including contacts and vias with small dimensions is required in order to participate in the continuing trend toward higher device densities. Procedures that increase resolution, improved critical dimension control, and provide small features are therefore desired. Particularly, procedures that permit complete landing of interlevel connections over underlying conductor are desired.

SUMMARY OF THE INVENTION

The present invention provides methods of forming sub-lithographic features. The present invention more particularly provides sub-lithographic features that are particularly useful for forming interlevel connections. Using the methods of the present invention, it is possible to form fully landed contacts and vias over underlying conductors, despite the small size of the underlying conductors. As a result, the present invention effectively addresses the concerns raised by the trend towards the miniaturization of semiconductor devices.

In one embodiment, the present invention relates to a method of forming a sub-lithographic via, involving the steps of providing a substrate comprising a conductor having a width of about 0.25 $\mu$m or less over a portion of the substrate and an insulating film over the conductor and the substrate; etching a preliminary via in the insulating film over the conductor, the preliminary via defined by sidewalls in the insulating film; depositing a CVD layer over the substrate, the insulating film, and the conductor, the CVD layer having a vertical portion adjacent the sidewalls of the insulating film and a horizontal portion in areas not adjacent the sidewalls of the insulating film; and removing the horizontal portion of the CVD layer thereby forming the sub-lithographic via over the conductor, the sub-lithographic via having a width of less than about 0.25 $\mu$m.

In another embodiment, the present invention relates to a method of forming a sub-lithographic contact, involving the steps of providing a substrate comprising a conductor having a width of about 0.25 $\mu$m or less over a portion of the substrate and an insulating film over the conductor and the substrate; etching a preliminary via in the insulating film over the conductor, the preliminary via defined by sidewalls in the insulating film; depositing a CVD layer over the substrate, the insulating film, and the conductor, the CVD layer having a vertical portion adjacent the sidewalls of the insulating film and a horizontal portion in areas not adjacent the sidewalls of the insulating film; removing the horizontal portion of the CVD layer thereby forming the sub-lithographic via over the conductor, the sub-lithographic via having a width of less than about 0.25 $\mu$m; and depositing a conductive material into the sub-lithographic via thereby forming the sub-lithographic contact.

In yet another embodiment, the present invention relates to a method of forming a sub-lithographic interlevel contact, involving the steps of providing a substrate comprising a conductor having a width of about 0.25 $\mu$m or less over a portion of the substrate and an insulating film over the conductor and the substrate, the conductor comprising at least one of aluminum, copper, titanium, and tungsten; etching a preliminary via in the insulating film over the conductor, the preliminary via defined by sidewalls in the insulating film; depositing a CVD layer over the substrate, the insulating film, and the conductor, the CVD layer having a vertical portion adjacent the sidewalls of the insulating film and a horizontal portion in areas not adjacent the sidewalls of the insulating film, the CVD layer having a thickness from about 100 Å to about 3,000 Å; removing the horizontal portion of the CVD layer thereby forming the sub-lithographic via over the conductor, the sub-lithographic via having a width of less than about 0.25 $\mu$m; and depositing a conductive material into the sub-lithographic via thereby forming the sub-lithographic contact, the conductive material comprising at least one of aluminum, copper, titanium, and tungsten.

DISCLOSURE OF INVENTION

The present invention involves forming contacts and vias with improved overlap to small underlying conductors. The present invention more specifically involves forming contacts and vias on a sub-lithographic scale using chemical vapor deposition and etch back processing. As a result, the present invention provides fully landed vias/contacts over underlying conductors.

Referring to FIGS. 3–7, the present invention is explained in detail. Specifically referring to FIG. 3, a substrate 20 is shown having a conductor 22 and insulating material 24 thereover. The substrate 20 is typically a silicon substrate optionally with various elements, devices and/or layers therein and/or thereover; including metal layers, barrier layers, dielectric layers, device structures, active elements and passive elements including polysilicon gates, wordlines, source regions, drain regions, bit lines, bases, emitters, collectors, conductive lines, conductive plugs, etc. The conductor 22 has a width as small as about 0.1 µm or less, such as about 0.25 µm or less, about 0.18 µm or less, about 0.15 µm or less, about 0.13 µm or less, and about 0.1 µm or less. In this embodiment, the conductor 22 comprises aluminum and has a width of about 0.1 µm.

The conductor 22 contains a material that conducts or semiconducts electrical current. Conductor materials include metals and silicon containing materials, such as doped or undoped polysilicon and amorphous silicon. Metals include single metals as well as metal alloys containing two or more metals. Specific examples of metals include aluminum, copper, gold, nickel, palladium, platinum, silver, tantalum, titanium, tungsten, zinc, aluminum-copper alloys, aluminum alloys, copper alloys, titanium alloys, tungsten alloys, titanium-tungsten alloys, gold alloys, nickel alloys, palladium alloys, platinum alloys, silver alloys, tantalum alloys, zinc alloys, metal silicides, and any other alloys thereof. In this embodiment, the conductor 22 comprises aluminum.

The insulating material 24 is any suitable electrically insulating material. Insulating materials include silicon based materials such as silicon oxide, silicon nitride and silicon oxynitride; low K polymer materials; and oxide glasses. Low K polymer materials are materials having low dielectric constants and include polyimides, fluorinated polyimides, polysilsequioxane, benzocyclobutene (BCB), parlene F, parlene N and amorphous polytetrafluoroethylene. A specific example of a commercially available low K polymer material is Flare™ from AlliedSignal believed to be derived from perfluorobiphenyl and aromatic bisphenols. Oxide glasses include fluorine doped silicon glass (FSG), tetraethylorthosilicate (TEOS), phosphosilicate glass (PSG), borophosphosilicate glass (BPSG), any other suitable spin-on glass. In this embodiment, the insulating material 24 comprises silicon oxide.

Figure 1:
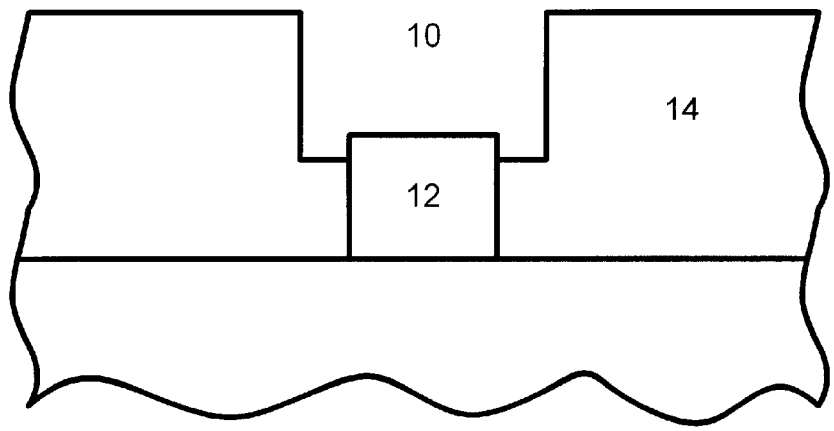
FIG. 1 illustrates in a cross-sectional view a conventional method of forming an interlevel connection.
Figure 2:
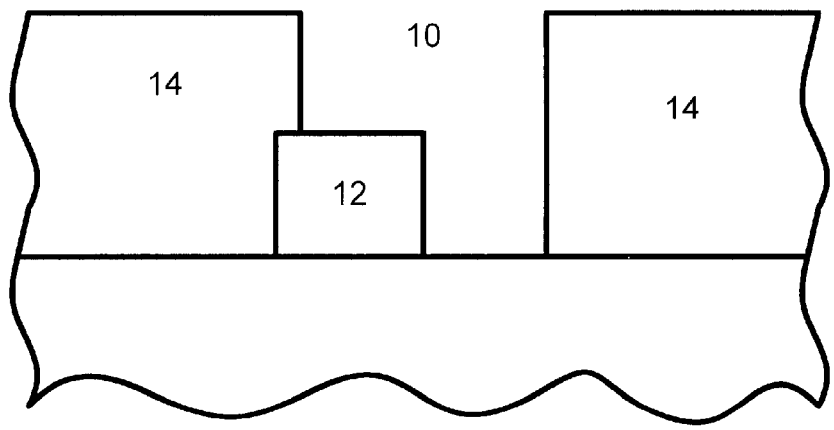
FIG. 2 illustrates in a cross-sectional view another conventional method of forming an interlevel connection.
Figure 3:
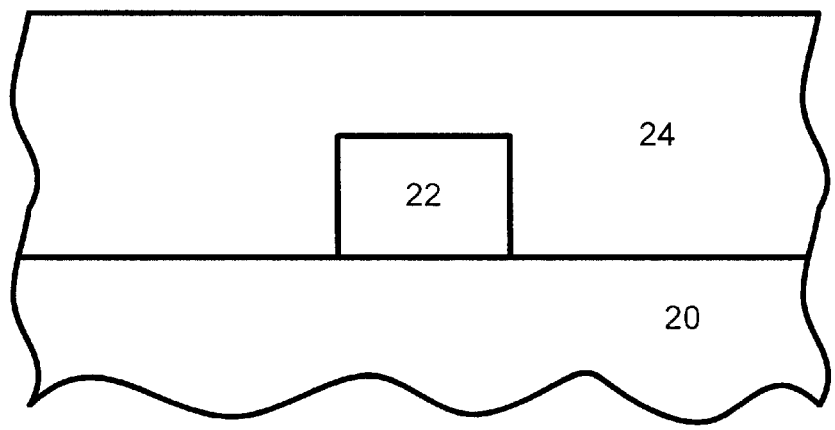
FIG. 3 illustrates in a cross-sectional view the methods of forming a sub-lithographic structure according to several aspects of the present invention.
Figure 4:
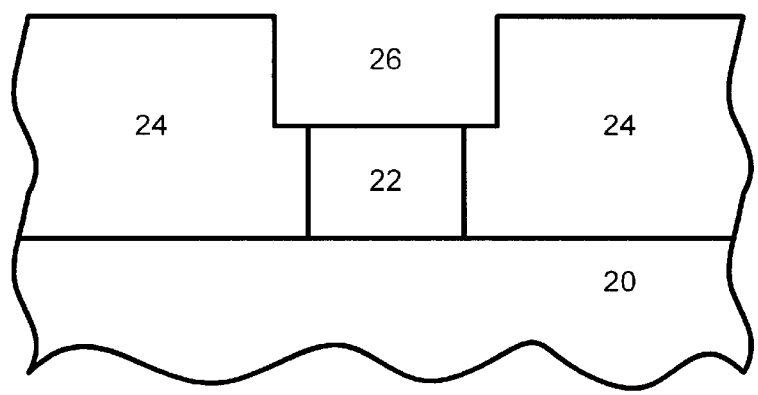
FIG. 4 illustrates in a cross-sectional view the methods of forming a sub-lithographic structure according to several aspects of the present invention.

Referring to FIG. 4, a preliminary via 26 is formed over conductor 22 in insulating material 24 using suitable lithographic techniques. The width of the preliminary via 26 can be larger or smaller than the width of the conductor 22, but it typically is larger than the width of the conductor 22. In this connection, the width of the preliminary via 26 is as small as about 0.11 µm or less, but typically the width is 0.3 µm or less or 0.25 µm or less.

Suitable etch techniques include depositing, irradiating, and developing (patterning) a photoresist (not shown) to expose a portion of the insulating material 24 over the conductor 22; followed by etching the exposed portion of the insulating material 24 over the conductor 22; and stripping or removing the remaining portions of the photoresist from the substrate 20. The specific etch technique/chemistry primarily depends upon the identity of the insulating material 24.

Suitable dry or wet etching techniques may be employed to form preliminary via 26 in insulating material 24. Wet etch techniques involve using a buffered acid such as HF, HCl, and $H_3PO_4$. Dry etch techniques involve using one or more fluorine compounds, carbon compounds, and oxygen compounds such as one or more of $SF_6$, $NF_3$, $CF_4$, $C_2F_6$, CO, $O_2$, $C_4F_8$ and $CHF_3$ optionally with Ar or $H_2$. For example, in an embodiment where layer 24 contains BPSG, a dry etch using Ar and one of $CF_4$ and $CHF_3$ may be employed. In a preferred embodiment, reactive ion etching is employed. In a preferred embodiment, the insulating material 24 is etched using an anisotropic etching process. In this embodiment, $CF_4$ is employed to etch the silicon oxide insulating material 24.

Figure 5:
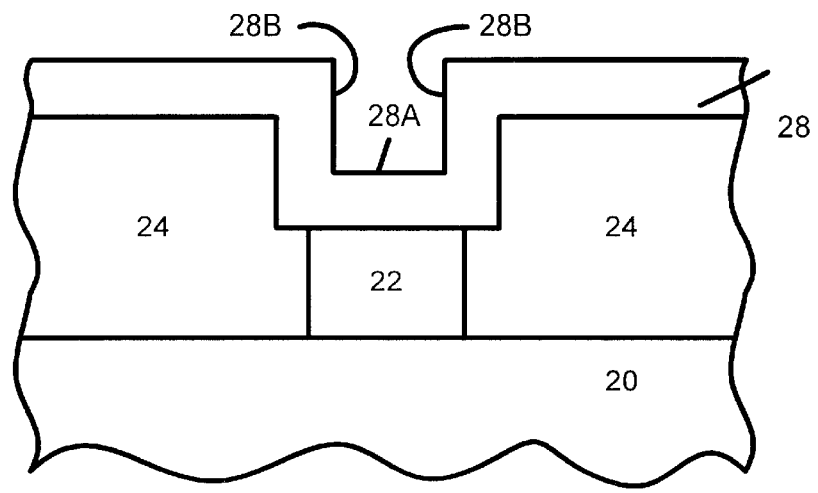
FIG. 5 illustrates in a cross-sectional view the methods of forming a sub-lithographic structure according to several aspects of the present invention.

Referring to FIG. 5, CVD layer 28 is deposited over the etched substrate. The CVD layer 28 is made using chemical vapor deposition (CVD) techniques including low pressure chemical vapor deposition (LPCVD) and plasma enhanced chemical vapor deposition (PECVD). In a preferred embodiment, the CVD layer 28 comprises an insulating material that can be deposited by CVD techniques. CVD insulating materials are materials capable of deposition by CVD techniques including silicon based materials such as silicon oxide, silicon nitride and silicon oxynitride and oxide glasses.

In one embodiment, the CVD layer 28 is a silicon nitride film and may be made by PECVD or LPCVD employing gases containing silicon and nitrogen, such as using $SiH_4$ or $SiCl_2H_2$ and $N_2$ or $NH_3$. In another embodiment, the CVD layer 28 is a silicon oxide film and may be made by PECVD or LPCVD employing gases containing silicon and oxygen, such as using $SiH_4$ or $SiCl_2H_2$ and $N_2O$ or $O_2$. In yet another embodiment, the CVD layer 28 is a silicon oxynitride film and may be made by PECVD or LPCVD employing gases containing silicon, oxygen and nitrogen, such as using $SiH_4$ and $N_2O$ and $NH_3$. In this embodiment, the CVD layer 28 is a silicon nitride film.

In a preferred embodiment, the CVD layer 28 is deposited over the entire substrate. The CVD layer 28 conforms to the profile of the etched substrate; that is, over the insulating material 24 and in the preliminary via 26 (including over the exposed conductor 22 and sidewalls in the insulating material 24). The CVD layer 28 is formed in a uniform or substantially uniform thickness over the insulating material 24 and in the preliminary via 26.

In one embodiment, the CVD layer 28 has a thickness from about 100 Å to about 3,000 Å. In another embodiment, the CVD layer 28 has a thickness from about 200 Å to about 2,000 Å. In yet another embodiment, the CVD layer 28 has a thickness from about 300 Å to about 1,000 Å. In one embodiment, the thickness of the is substantially uniform over the insulating material 24 and in the preliminary via 26 in that the thickness does not vary by more than about 50 Å comparing the thickest and thinnest areas of the CVD layer 28. In this embodiment, the silicon nitride CVD layer 28 has a substantially uniform thickness of about 1,500 Å.

For purposes of this invention, there are two main portions of the CVD layer 28; namely, 28A and 28B. The first is a portion of the CVD layer 28B adjacent the sidewall(s) of the insulating material 24 in the preliminary via 26 and is referred to herein as the vertical portion. The second is a portion of the CVD layer 28A that covers the flat surfaces (parallel or substantially parallel to the plane of the flat surface of the substrate 20) of the insulating material 24 and conductor 22 and is referred to herein as the horizontal portion.

Figure 6:
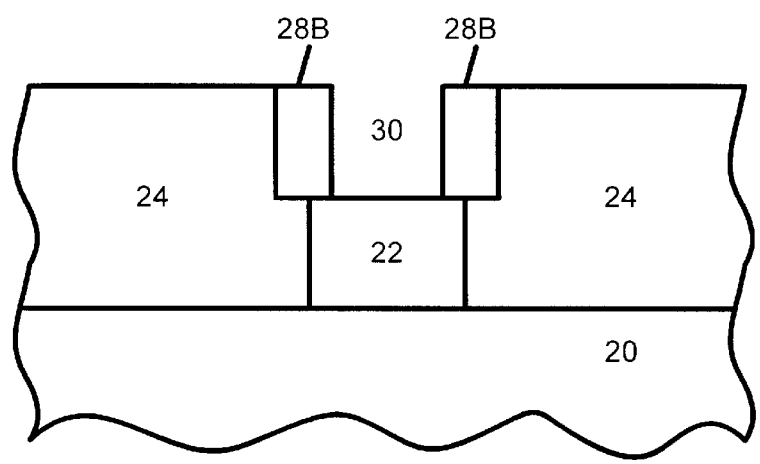
FIG. 6 illustrates in a cross-sectional view the methods of forming a sub-lithographic structure according to several aspects of the present invention.

Referring to FIG. 6, a directional etch or etch back is performed to remove portions of the CVD layer 28A covering the flat surfaces of the insulating material 24 and conductor 22 (the horizontal portion as defined in the paragraph above), while not substantially removing the vertical portion of the CVD layer 28B adjacent the sidewalls of the insulating material 24 in the preliminary via 26, thereby providing via 30. Dry or wet etching techniques may be employed. In a preferred embodiment, a dry anisotropic etch process is employed whereby the horizontal portion of the CVD layer 28A are removed. In one embodiment, a reactive ion etch (RIE) technique is employed. The specific etchant depends upon the specific identity of the CVD layer 28. Dry etch techniques typically involve using a plasma containing one or more fluorine compounds, carbon compounds, and oxygen compounds such as one or more of $SF_6$, $NF_3$, $CF_4$, $C_2F_6$, CO, $O_2$, $C_4F_8$ and $CHF_3$ optionally with Ar or $H_2$. The etch technique is selected so that the insulating material 24 and conductor 22 are not significantly etched or degraded. In this connection, the insulating material 24 and conductor 22 act as etch stop layers when performing the directional etch of the horizontal portions of the CVD layer 28A.

While the directional etch removes the horizontal portions of the CVD layer 28A, a small amount of the vertical portion of the CVD layer 28B may be also removed. However, in most instances, the small amount of the vertical portion removed substantially corresponds with the thickness of the CVD layer 28 thus leaving a vertical portion of the CVD layer 28B (having a height equal to or slightly less than the height of the depth of the preliminary via 26).

The width of via 30 is smaller than the width of the preliminary via 26. The width of via 30 can be sub-lithographic in size, since its dimensions are not directly or solely related to lithography techniques or limits. The via 30 has a width as small as about 0.05 $\mu$m or less, such as less than about 0.25 $\mu$m, about 0.2 $\mu$m or less, about 0.18 $\mu$m or less, about 0.15 $\mu$m or less, about 0.13 $\mu$m or less, about 0.1 $\mu$m or less, about 0.075 $\mu$m or less, and about 0.05 $\mu$m or less. In this embodiment, the via 30 has a width of about 0.07 $\mu$m.

Figure 7:
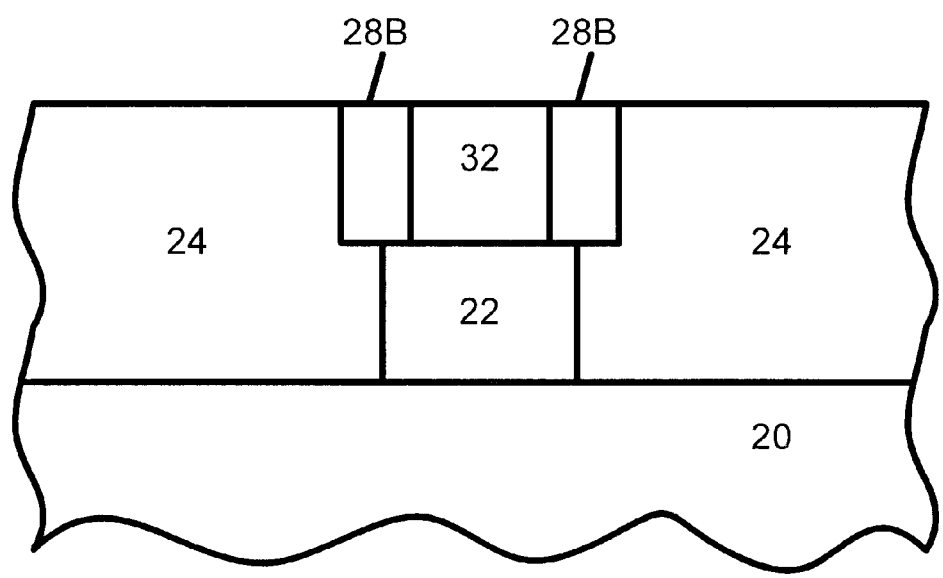
FIG. 7 illustrates in a cross-sectional view the methods of forming a sub-lithographic structure according to several aspects of the present invention.

Referring to FIG. 7, contact 32 is formed in via 30 using suitable techniques. The contact 32 contains a material that conducts or semiconducts electrical current. Contact materials include the same materials used as the conductor 22; namely, metals and silicon containing materials, such as doped or undoped polysilicon and amorphous silicon. Specific examples of metals include aluminum, copper, gold, nickel, palladium, platinum, silver, tantalum, titanium, tungsten, zinc, aluminum-copper alloys, aluminum alloys, copper alloys, titanium alloys, tungsten alloys, titanium-tungsten alloys, gold alloys, nickel alloys, palladium alloys, platinum alloys, silver alloys, tantalum alloys, zinc alloys, metal silicides, and any other alloys thereof. In this embodiment, the contact 32 contains aluminum.

In one embodiment, the contact 32 and the conductor 22 contain the same material. In another embodiment, the contact 32 and the conductor 22 contain different materials, such as a conductor containing aluminum and/or copper and a contact containing tungsten.

The contact 32 is formed using any suitable technique, such as using physical vapor deposition (PVD) techniques or sputtering. In a preferred embodiment, contact 32 is formed over the substrate, filling via 30 and covering insulating material 24 (not shown). The contact material is then planarized to the surface of the substrate; that is, until portions of the contact 32 have been removed from the top surface of insulating material 24. Via 30 remains filled with the conductive contact material. Any suitable technique may be used to planarize the substrate and may depend, for instance, on the material used to make the contact 32. In a preferred embodiment, the substrate is planarized using chemical mechanical polishing (CMP) techniques using a polishing solution or slurry depending upon the materials used for the contact 32.

Although not shown in the Figures, the conductor 22 and/or contact 32 may include a barrier metal layer. In a preferred embodiment, when one or both the conductor 22 and contact 32 contain copper or a copper alloy, a barrier metal layer surrounds the conductor 22 and/or contact 32 thereby preventing copper from deleteriously diffusing through the adjacent insulating material 24. In this preferred embodiment, the barrier metal layer is made of titanium nitride. In another preferred embodiment, when one or both the conductor 22 and contact 32 contain copper or a copper alloy and the insulating material 24 contains silicon oxide or silicon oxynitride, a barrier metal layer surrounds the conductor 22 and contact 32.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of forming a sub-lithographic via, comprising:

providing a substrate comprising a conductor having a width of about 0.25 $\mu$m or less over a portion of the substrate and an insulating film over the conductor and the substrate;

etching a preliminary via in the insulating film over the conductor, the preliminary via defined by sidewalls in the insulating film;

depositing a CVD layer over the substrate, the insulating film, and the conductor, the CVD layer having a vertical portion adjacent the sidewalls of the insulating film and a horizontal portion in areas not adjacent the sidewalls of the insulating film; and removing the horizontal portion of the CVD layer thereby forming the sub-lithographic via over the conductor, the sub-lithographic via having a width of less than about 0.25 µm.

2. The method of claim 1, wherein the conductor comprises one or more of a silicon containing material, aluminum, copper, gold, nickel, palladium, platinum, silver, tantalum, titanium, tungsten, and zinc.

3. The method of claim 1, wherein the insulating film and the CVD layer comprise different materials.

4. The method of claim 1, wherein the CVD layer has a thickness from about 100 Å to about 3,000 Å.

5. The method of claim 1, wherein the horizontal portion of the CVD layer is removed using an anisotropic etching technique.

6. The method of claim 1, wherein the sub-lithographic via having a width of about 0.2 µm or less.

7. A method of forming a sub-lithographic contact, comprising:

providing a substrate comprising a conductor having a width of about 0.25 µm or less over a portion of the substrate and an insulating film over the conductor and the substrate;

etching a preliminary via in the insulating film over the conductor, the preliminary via defined by sidewalls in the insulating film;

depositing a CVD layer over the substrate, the insulating film, and the conductor, the CVD layer having a vertical portion adjacent the sidewalls of the insulating film and a horizontal portion in areas not adjacent the sidewalls of the insulating film;

removing the horizontal portion of the CVD layer thereby forming the sub-lithographic via over the conductor, the sub-lithographic via having a width of less than about 0.25 µm; and depositing a conductive material into the sub-lithographic via thereby forming the sub-lithographic contact.

8. The method of claim 7, wherein the conductor and the conductive material independently comprise one or more of a silicon containing material, aluminum, copper, gold, nickel, palladium, platinum, silver, tantalum, titanium, tungsten, and zinc.

9. The method of claim 7, wherein the insulating film and the CVD layer independently comprise one or more of silicon oxide, silicon nitride, silicon oxynitride, polyimides, fluorinated polyimides, polysilsequioxane, benzocyclobutene, parlene F, parlene N, amorphous polytetrafluoroethylene, fluorine doped silicon glass, tetraethylorthosilicate, phosphosilicate glass, and borophosphosilicate glass.

10. The method of claim 7, wherein the CVD layer has a thickness from about 200 Å to about 2,000 Å.

11. The method of claim 7, wherein the CVD layer is deposited using one of low pressure chemical vapor deposition and plasma enhanced chemical vapor deposition.

12. The method of claim 7, wherein the horizontal portion of the CVD layer is removed using reactive ion etching.

13. The method of claim 7, wherein at least one of the conductor and the conductive material comprise a barrier metal layer.

14. The method of claim 7, wherein the preliminary via is etched in the insulating film using photolithographic techniques.

15. A method of forming a sub-lithographic interlevel contact, comprising:

providing a substrate comprising a conductor having a width of about 0.25 µm or less over a portion of the substrate and an insulating film over the conductor and the substrate, the conductor comprising at least one of aluminum, copper, titanium, and tungsten;

etching a preliminary via in the insulating film over the conductor, the preliminary via defined by sidewalls in the insulating film;

depositing a CVD layer over the substrate, the insulating film, and the conductor, the CVD layer having a vertical portion adjacent the sidewalls of the insulating film and a horizontal portion in areas not adjacent the sidewalls of the insulating film, the CVD layer having a thickness from about 100 Å to about 3,000 Å;

removing the horizontal portion of the CVD layer thereby forming the sub-lithographic via over the conductor, the sub-lithographic via having a width of less than about 0.25 µ; and depositing a conductive material into the sub-lithographic via thereby forming the sub-lithographic contact, the conductive material comprising at least one of aluminum, copper, titanium, and tungsten.

16. The method of claim 15, wherein the insulating film comprises at least one of a silicon based material, a low K polymer material, and an oxide glass.

17. The method of claim 15, wherein the CVD layer comprises at least one of silicon oxide, silicon nitride, and silicon oxynitride.

18. The method of claim 15, wherein the CVD layer has a thickness from about 300 Å to about 1,000 Å.

19. The method of claim 15, wherein the sub-lithographic contact has a width of about 0.15 µm or less.

20. The method of claim 15, wherein the conductive material is subjected to chemical mechanical polishing after deposition into the sub-lithographic via to form the sub-lithographic contact.

* * * * *